United States Patent [19]
Philpott et al.

[11] Patent Number: 5,262,783
[45] Date of Patent: Nov. 16, 1993

[54] MOTION DETECTOR UNIT

[75] Inventors: Andrew G. Philpott, Watford; Ian R. Aldred, Richmansworth; Robert T. J. Dodd, Stanmore; Reginald F. Humphryes, Weston Turville, all of England

[73] Assignee: GEC-Marconi Limited, England

[21] Appl. No.: 916,111

[22] PCT Filed: Nov. 27, 1991

[86] PCT No.: PCT/GB91/02099
§ 371 Date: Jul. 29, 1992
§ 102(e) Date: Jul. 29, 1992

[87] PCT Pub. No.: WO92/09905
PCT Pub. Date: Jun. 11, 1992

[30] Foreign Application Priority Data
Nov. 30, 1990 [GB] United Kingdom ............... 9026037

[51] Int. Cl.⁵ ..................... G01S 13/56; G01S 13/62
[52] U.S. Cl. ..................... 342/28; 342/114; 455/327
[58] Field of Search ............ 342/28, 114; 455/326, 455/327, 330

[56] References Cited
U.S. PATENT DOCUMENTS

| | | | |
|---|---|---|---|
| 3,845,461 | 10/1974 | Foreman | 342/28 X |
| 3,955,194 | 5/1976 | Chua | 342/114 |
| 4,195,296 | 3/1980 | Williams | 342/114 |
| 4,249,263 | 2/1981 | Shinkawa et al. | 455/327 |
| 4,286,260 | 8/1981 | Gershberg et al. | 342/28 X |
| 4,499,467 | 2/1985 | Rittenbach | 342/114 X |
| 4,731,611 | 3/1988 | Müller et al. | 342/28 |
| 5,153,536 | 10/1992 | Müller | 455/327 X |

Primary Examiner—T. H. Tubbesing
Attorney, Agent, or Firm—Kirschstein, Ottinger, Israel & Schiffmiller

[57] ABSTRACT

A unit for detecting a moving person or object by means of doppler frequency shift. The unit comprises a microwave circuit board (1) accommodating an oscillator and a mixer, and an antenna board (2) carrying transmit (8) and receive (9) patch arrays. In the assembled unit the two boards (1,2) are disposed adjacent one another. Coupling between the microwave circuit and the antenna arrays is achieved by two slots (6,11) resonant at the oscillator fundamental frequency and formed in a ground plane (5) on the microwave board (1). Feed striplines (7,10,12) on the two boards (1,2) lie orthogonal to the slots (6,11) and are terminated in T-sections (15,14). The stripline/slot arrangement suppresses emission at the oscillator second harmonic frequency. The antenna board (2) has no electrical connection to the microwave circuit, enabling the radiated beam shape to be changed by simply replacing the antenna board with one having a different patch array pattern.

9 Claims, 6 Drawing Sheets

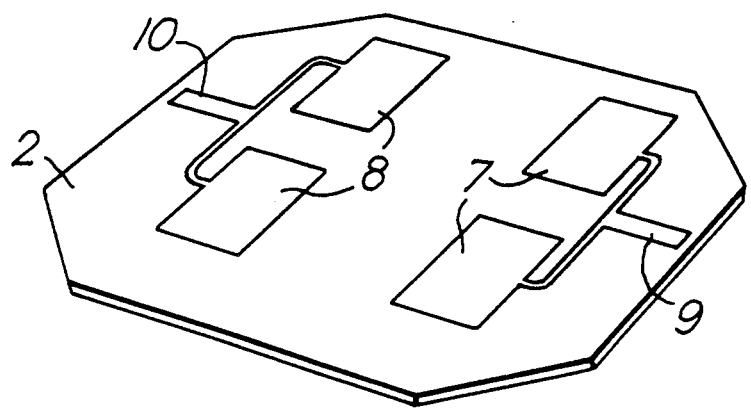
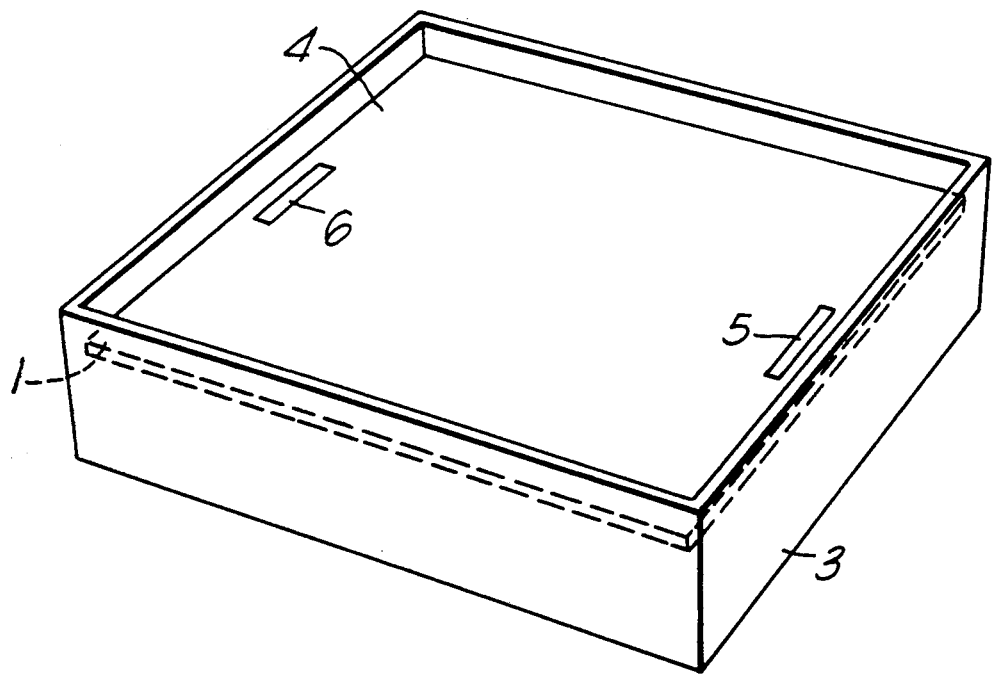
Fig. 1.

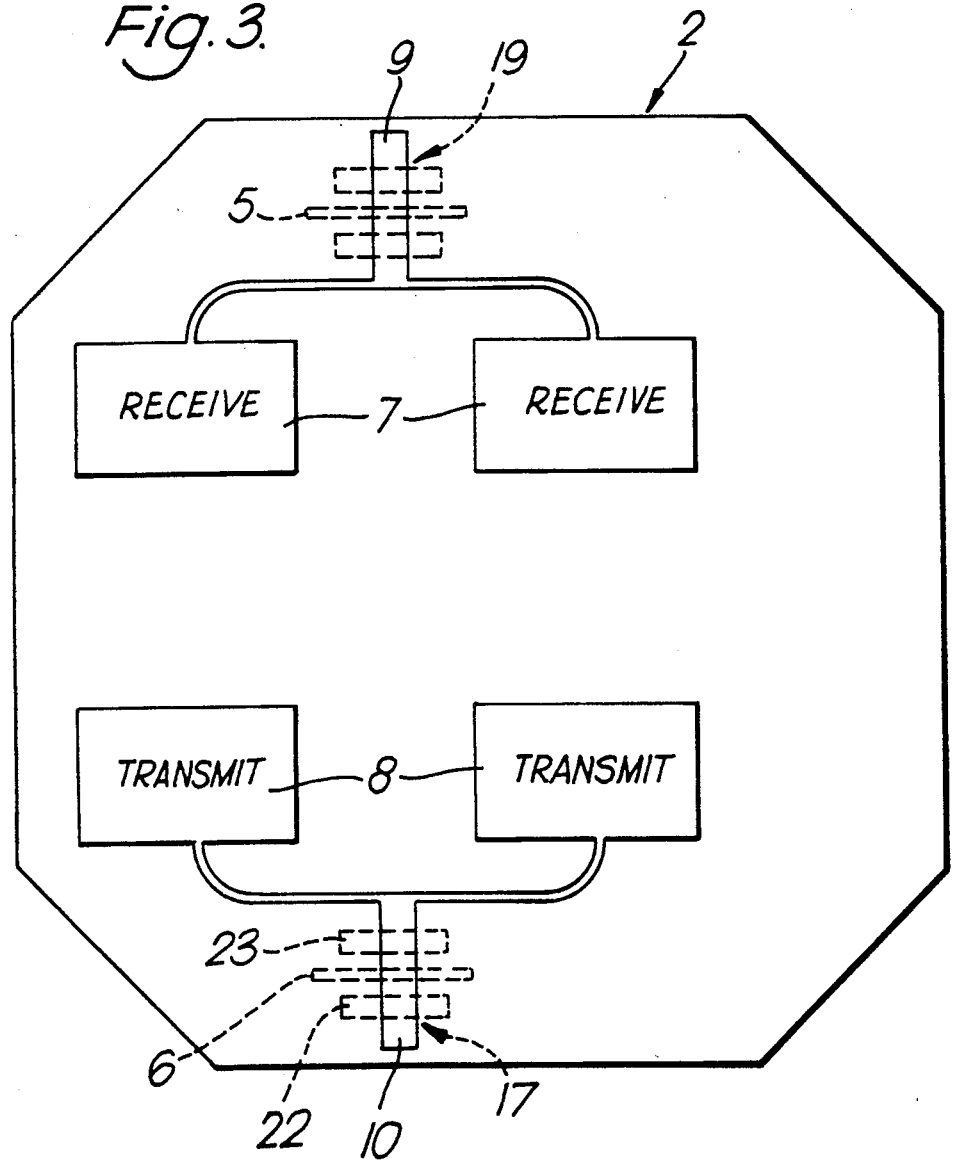

VIEW ON ARROW A

SECTION ON LINE B-B

VIEW ON ARROW C

MOTION DETECTOR UNIT

BACKGROUND OF THE INVENTION

1. Field of the Invention

This invention relates to a motion detector unit for detecting a moving person or object by means of doppler frequency shift.

2. Description of Related Art

The use of the doppler effect for detecting such motion is well-known. Typical applications include intruder alarms and automatic door openers, for which a unit of conventional construction comprises a gunn diode oscillator mounted in a cavity resonator such as a simple waveguide tube. A diode mixer also mounted in the tube provides an output at the doppler frequency. This construction has a number of drawbacks: its relative complexity for mass-production, the power consumption of the oscillator, and, especially, difficulties in meeting the stringent harmonic radiation suppression requirements imposed by the regulatory authorities in most countries.

SUMMARY OF THE INVENTION

It is an object of the present invention to provide a motion detector unit which can be more cheaply and conveniently fabricated and which to a considerable extent overcomes the aforementioned shortcomings.

According to one aspect of the invention a motion detector unit for detecting motion by means of doppler frequency shift comprises a microwave circuit board, an antenna circuit board, and a ground plane layer, the two boards being superimposed with the ground plane layer intervening, the microwave circuit board comprising an oscillator and a mixer, and the antenna circuit board comprising transmit and receive antennas, each antenna having a respective feed stripline which substantially overlies an associated stripline on the microwave circuit board, the ground plane layer having, for each antenna, a respective slot to provide coupling between the microwave circuit and the antenna, the slot being resonant at the fundamental frequency of the oscillator, with said feed stripline and said associated stripline lying orthogonal to the resonant dimension of the slot and extending beyond the slot.

Preferably at least one of the feed stripline and the associated stripline terminates in a T-section comprising a cross-bar strip parallel with the slot.

If the stripline on the microwave circuit board terminates in such a T-section, it preferably includes a further cross-bar strip parallel with the slot but on the opposite side of the slot to the T-secton.

In one embodiment of the invention, the mixer comprises a pair of diodes connected in series, the common connection point of the diodes constituting a first input of the mixer, and a stripline section which connects the other ends of the diodes via high-pass capacitance means, a second input of the mixer being at such a point on the stripline section as to introduce a quadrature phase difference between signals applied to the two diodes via the second input, the two mixer inputs being coupled respectively to the oscillator and the receive antenna, the mixer producing, in operation, two doppler outputs at the terminals of the capacitance means of identical frequency but differing phase, the phase relationship of the two outputs being indicative of the sense of the detected motion.

The first input of the mixer may be coupled to the oscillator and the second input of the mixer coupled to the stripline on the microwave circuit board which is associated with the receive antenna.

Each antenna preferably comprises an array of patch elements connected to a said feed stripline on the antenna circuit board.

Said ground plane layer is preferably carried by the microwave circuit board.

According to another aspect of the invention a microwave mixer, for use in detecting target motion by means of doppler frequency shift, comprises a pair of diodes connected in series, the common connection point of the diodes constituting a first input of the mixer, and a stripline section which connects the other ends of the diodes via high-pass capacitance means, the stripline section having a length which is such as to introduce a quadrature phase difference between signals applied to the two diodes via a second input of the mixer at a point on the stripline section, the two mixer inputs being coupled respectively in use to a sample of a transmitted microwave signal and a received echo of the transmitted signal from a moving target, the mixer producing, in operation, two doppler outputs at the terminals of the capacitor of identical frequency but differing phase, the phase relationship of the two outputs being indicative of the sense of the detected target motion.

BRIEF DESCRIPTION OF THE DRAWINGS

A motion detector unit in accordance with the invention will now be described, by way of example only, with reference to the accompanying drawings, in which:

FIG. 1 is a view showing basic constructional features of the unit;

FIG. 3 shows an antenna circuit board for use in association with the board of FIG. 2;

DETAILED DESCRIPTION OF THE PREFERRED EMBODIMENTS

Figure 2:
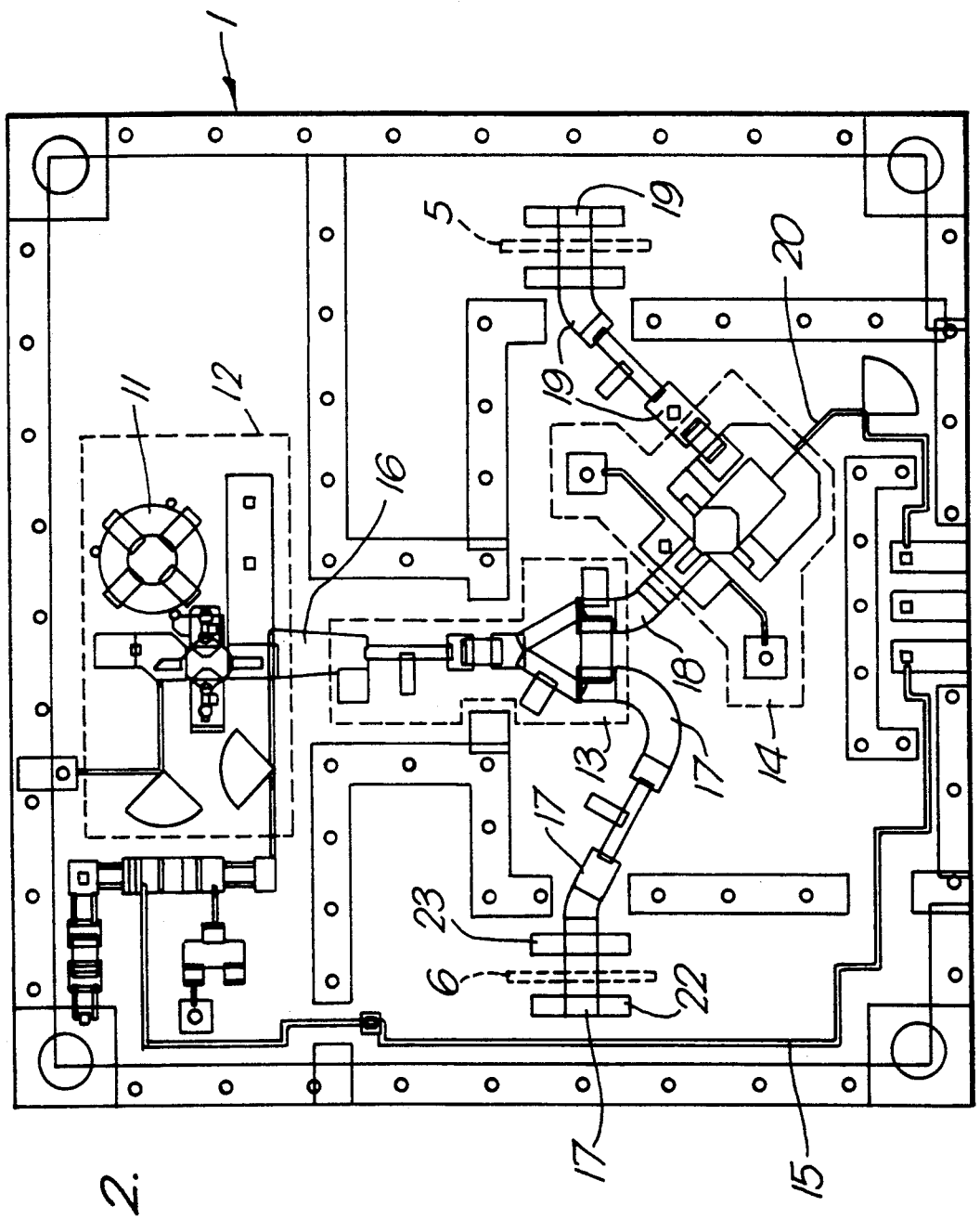
FIG. 2 shows a microwave circuit board suitable for use in the unit.

Referring to FIG. 1, the unit comprises two circuit boards 1,2 mounted adjacent and parallel to one another, i.e. in a stacked, face-to-face configuration. The two circuit boards are housed in a metallic box 3 or other suitable screened enclosure. Board 2 is shown removed from the box in the figure. Board 1 accommodates microwave circuitry on its inwardly-directed face (not shown). As shown, the box 3 is open at one side to expose the other face of board 1. This face has a ground plane layer 4 which further screens the microwave circuitry. Thus, circuit board 1 is of conventional double-sided microstripline type, FIG. 2 shows the microwave circuit board I in more detail, as viewed from the component side of the board. The principal components comprise a microwave oscillator 12, a signal splitter 13 and a balanced diode mixer 14. Power is supplied to the oscillator 12 via a supply line 15. The oscillator is preferably an FET design employing a mechanically tunable dielectric resonator 11.

This type of oscillator has the advantages of lower power consumption and reduced spurious emission levels than, say, a conventional gunn diode-based design. The output of the oscillator is provided, via a line 16, to the signal splitter 13. The signal splitter incorporates filter components which selectively pass the required fundamental frequency signal and also prevent any d.c. component in the oscillator output from reaching the following stages of the circuit. The splitter 13 divides the oscillator signal between two striplines 17, 18. In the assembled unit, stripline 17 is coupled to transmit antennas 8 on board 2 (FIG. 1). Stripline 18 is connected to one input of the mixer 14. The other input of the mixer 14 is connected to a further stripline 19, which, in turn, is coupled to receive antennas 7 on board 2 (FIG 1). The oscillator 12 provides a "local oscillator" input to the mixer 14, which operates in a conventional homodyne manner. The mixer output on line 20, which constitutes the output signal of the unit, thus comprises a low frequency doppler signal of the order of 100 Hz which can be filtered and processed in known manner.

FIG. 3 shows the antenna circuit board 2. This board can be of single-sided construction, i.e. having a conductive layer on one face only, and carries separate transmit (8) and receive (7) antenna arrays. Each antenna array comprises two patch elements, which are interconnected and connected to common feed striplines 10 and 9 for the transmit (8) and receive (7) arrays respectively. In the assembled unit the antenna board 2 is secured, for example by glueing, atop the microwave circuit board 1, with the ground plane layer 4 intervening, so that the patch elements 7, 8 are exposed at the open side of the box 3. The alignment of the two boards is such that the transmit array feed line 10 on the antenna board overlies the associated stripline 17 on the microwave board. Similarly, the receive array feed line 9 on the antenna board overlies the associated stripline 19 on the microwave board. For each of the striplines 9, 10, 17, 19 the conductive layer 4 on the microwave board 1 provides the associated ground plane.

In accordance with the invention, coupling between the microwave circuit board 1 and the antenna board 2 is achieved by the provision of two narrow slots 5, 6 in the ground plane layer 4 of the microwave board (see FIG. 1). In FIGS. 2 and 3, the position of the slots 5,6 (shown dotted) in relation to the feed striplines 17, 19 on the component side of the board 1 can be seen. In the ensuing description, for the purposes of convenience, reference will be made solely to the coupling arrangement for the transmit patches 8 by means of the slot 6. However, it will be appreciated that the arrangement for the receive patches 7 by means of the slot 5 is in all material aspects identical.

Referring to FIGS. 2 and 3, it can be seen that the slot 6 and the stripline 17 lie mutually orthogonal, with the stripline "crossing" the slot so as to terminate a short distance beyond the slot. In the present, preferred, arrangement the stripline 17 features two cross-bar strips 22, 23 disposed parallel to and symmetrically about the slot 6. The cross-bar strip 22 lies at the end of the line 17 so as to form a T-section.

Figure 4A:
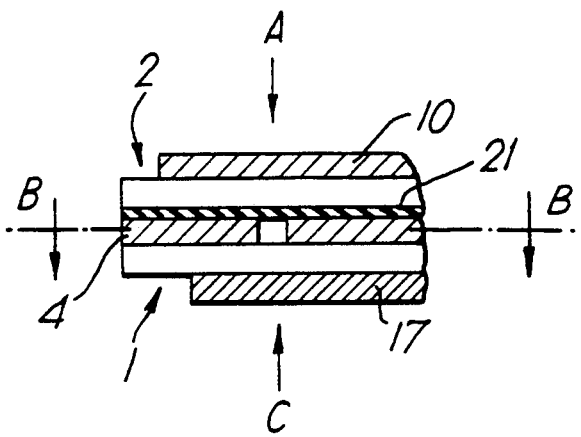
FIGS. 4a–4d show features of the two boards which provide coupling between the microwave circuit and the antennas.
Figure 4B:
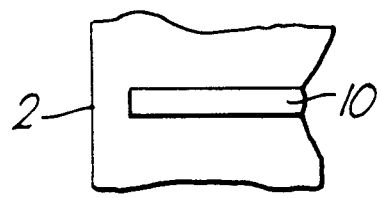
Figure 4C:
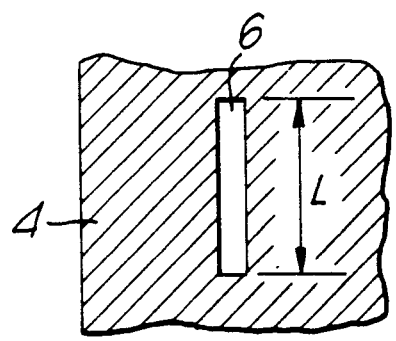
Figure 4D:
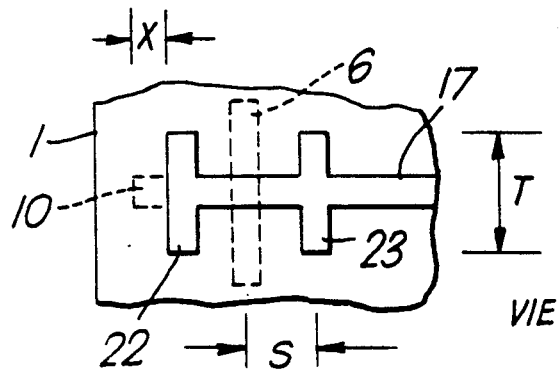

FIGS. 4(a)–4(d) show various views of the two boards 1, 2 in the vicinity of the slot 6. FIG. 4(a) is a section on a line through the stripline 17 and shows the boards in their 'assembled' state. The thicknesses of the conductive layers are exaggerated for clarity. The boards may be glued or otherwise secured together. If they are glued, a thin layer 21 of plastic or other insulating material may be sandwiched between the boards to assist bonding. It can be seen in FIG. 4(d) that, in this specific example, the antenna feed line 10 on board 2 overlies the stripline 17 on board 1, but extends a short distance x beyond the T-section termination 22 of stripline 17.

The length L of the slot 6 is chosen for resonance at the fundamental frequency of the oscillator, and corresponds approximately to a half-wavelength, the precise figure being determined by the guide wavelength in the dielectric substrate of board 1. The configuration of the striplines 10 and 17, in particular the length T of the cross-bar strips 22, 23, determines the degree of suppression of the second harmonic of the oscillator fundamental frequency. The optimum dimensions may be established empirically.

By way of example only, the following design details refer to the coupling arrangment used in one unit constructed in accordance with the invention:

| | |
|---|---|
| fundamental frequency | 10.6–10.7 GHz |
| impedance of microstrip lines 10, 12 | 50 ohms |
| dielectric substrate | FR4 (fibreglass resin p.c.b.) |
| length L of slot | 8.0 mm |
| width of slot | 0.5 mm |
| length T of cross-bar | 6.3 mm |
| width of cross-bar | 1.0 mm |
| separation s of slot and cross-bar | 1.5 mm |
| extent x of antenna feed line beyond T-section 22 | 1.5 mm |

In an alternative design, the antenna feed line 10 terminates in a cross-bar to form a T-section, in the same manner as the stripline 17. In this case, the feed line 10 does not extend beyond the end of the stripline 17, but rather the terminating T-sections of the two lines are coincident, i.e. overlie one another.

The use of the terminating T-sections on one or both of the striplines 10, 17 is not essential. Plain stripline stubs could be used instead, in which case the extent to which the stub line extends beyond the slot affects the harmonic suppression. However, an advantage of using a terminating T-section is that the stub line can be made shorter than would otherwise be possible, providing a saving in board space and giving a more compact size to the unit. It has been found that the provision of the second cross-bar strip 23 on stripline 17 gives a sharper response in rejecting the second harmonic, possibly by reducing radiation from the T-section cross-bar 22 itself.

As already mentioned, the coupling arrangement between the receive patches 7 and mixer input line 19 via the slot 5 is preferably the same as the arrangement just described for the transmit patches. This is important because there will be some leakage of the second harmonic to the receive patches from the mixer. The coupling arrangement reduces any such unwanted emission of the second harmonic via the receive patches.

The use of separate, but otherwise identical, patch arrays 7, 8 on the antenna board 2 ensures minimal signal wastage and allows a balanced mixer, rather than the traditional single-ended type, to be used. The balanced mixer provides a lower conversion loss and improved sensitivity due to the cancellation of AM noise from the oscillator.

Figure 5:
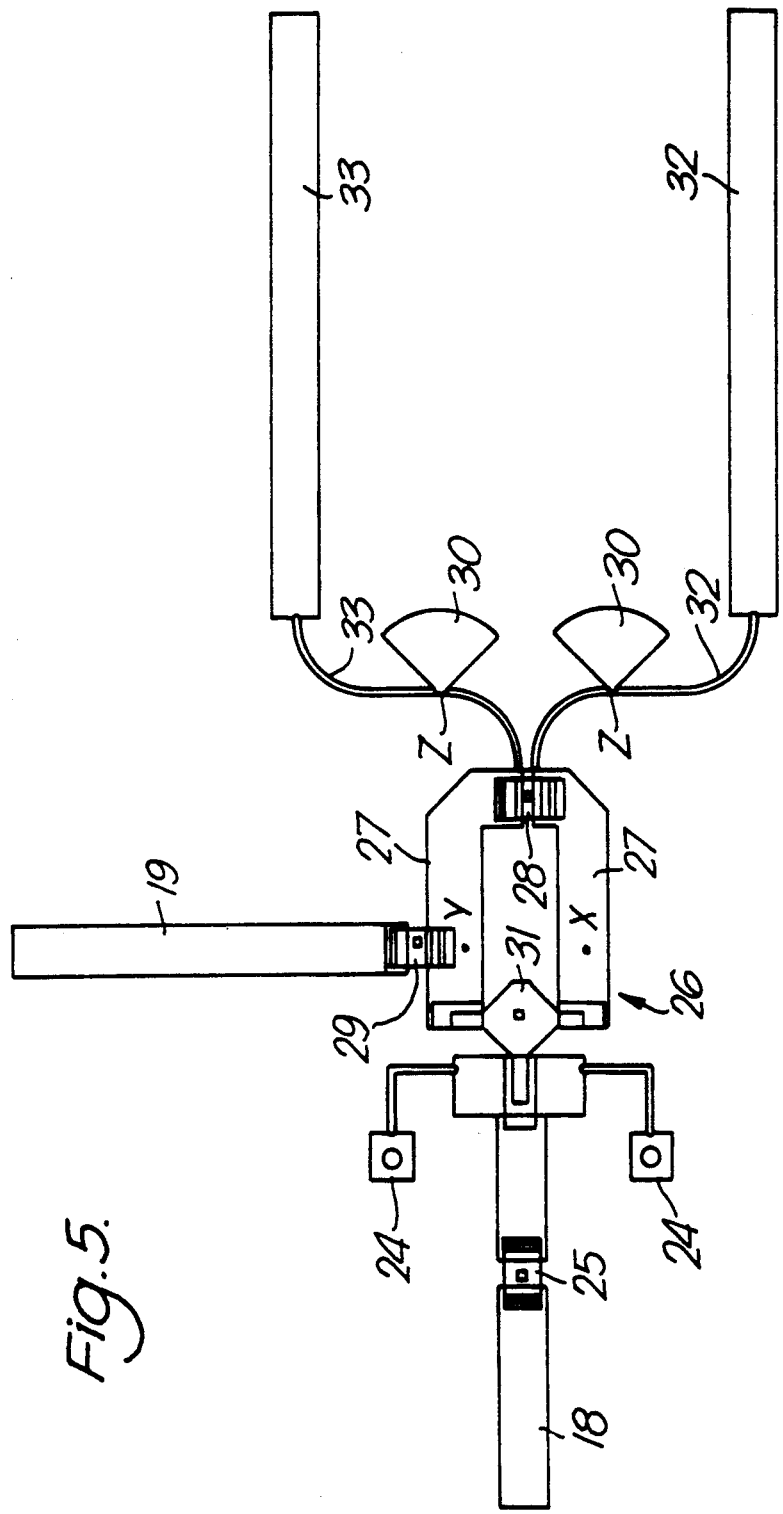
FIG. 5 shows a circuit board layout of an alternative design of mixer for use in the microwave circuit of FIG. 2.
Figure 6:
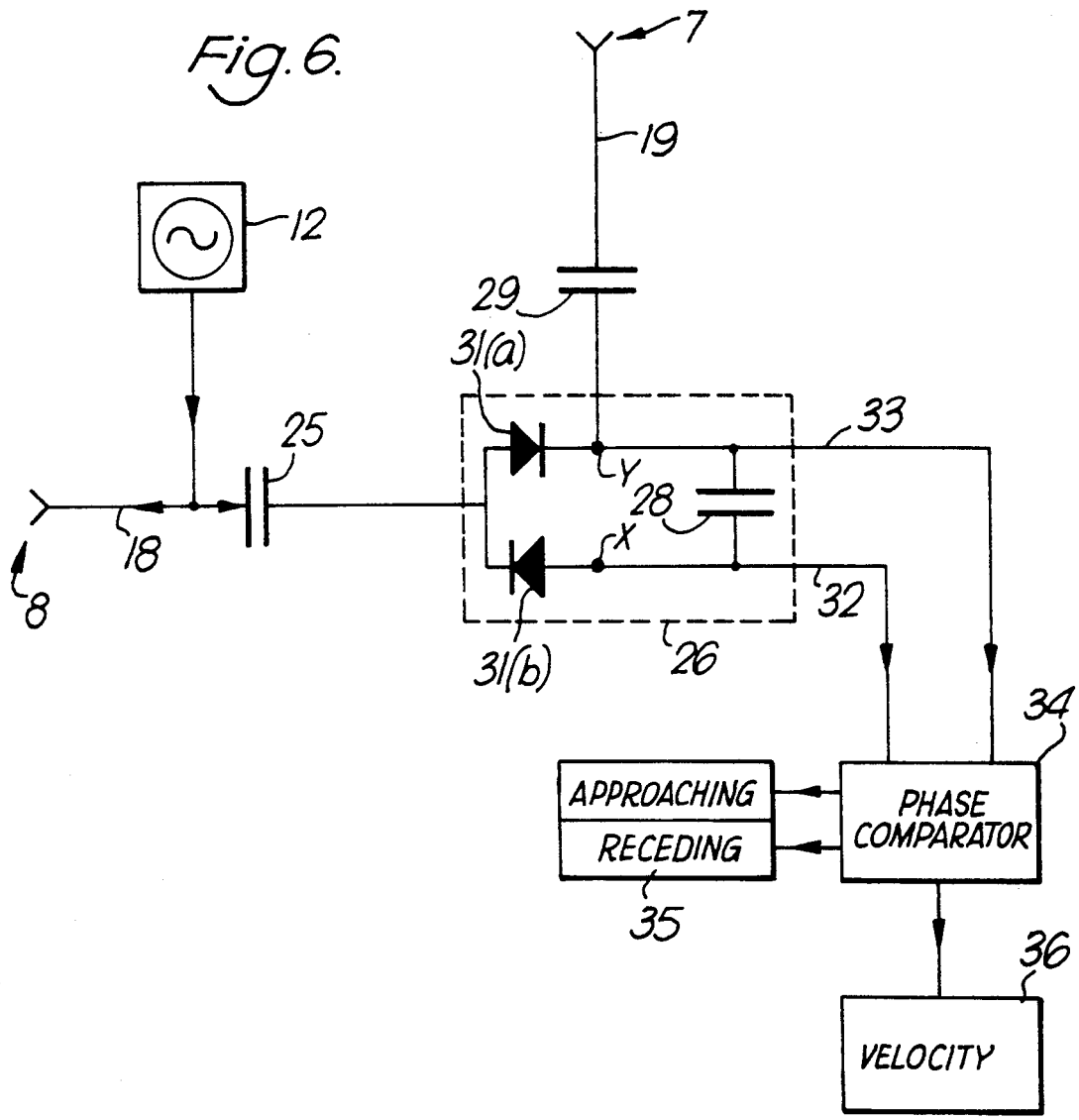
FIG. 6 is a circuit diagram of the mixer of FIG. 5.

In some applications for the unit it is desirable to know whether the detected motion is towards or away from the unit. For example, when the unit is being used to control automatic sliding doors, it is clearly useful to be able to distinguish the motion of a person approaching the doors from that of the same person having passed through, so that the doors are not held open for an unnecessarily long time. FIGS. 5 and 6 relate to a design of mixer which can be used in the unit in order to provide the facility of determining the sense of the detected motion.

It is well-established that the sign of the doppler frequency shift, and therefore the sense of the detected motion, may be found by splitting the received signal into two channels, each channel having a respective mixer. If corresponding inputs to the two mixers are supplied with versions of the oscillator signal which differ in phase by 90° or thereabouts, the sense of the detected motion may be determined according to the phase relationship of the mixer outputs, i.e. which one leads the other. As an alternative, the phase difference may be introduced between the received signal inputs to the mixers.

This known technique is adopted in the mixer configuration which will now be described with reference to the circuit board layout of FIG. 5 and the corresponding circuit diagram of FIG. 6. As in FIG. 2, the oscillator signal is supplied on line 18 and the received r.f. signal on line 19. The oscillator signal is supplied via a capacitor 25 which prevents any d.c. component from reaching the mixer. The r.f. signal is supplied to the mixer via an impedance-matching capacitor 29.

The mixer 26 comprises two series-connected mixer diodes 31 whose common connection constitutes a first input of the mixer and to which is coupled the oscillator input line 18. Two short-circuits 24, formed as connections through the circuit board to the ground plane, are transformed to microwave open-circuits at the mixer input, while providing a d.c. return path for the diode current. The other ends of the diodes 31 are "connected" via a stripline section 27 formed on the microwave board 1 and having a horseshoe-like shape. The stripline section 27 includes a "high-pass" capacitor 28 which passes the required r.f. signal whilst isolating the two low frequency doppler outputs of the mixer on lines 32 and 33. The r.f. signal is applied to a second input of the mixer at a point Y on the section 27 adjacent diode 31(*a*). The applied signal reaches this diode 31(*a*) directly and the other diode 31(*b*) via the horseshoe path through the capacitor 28 to a second point X adjacent the diode 31(*b*). The electrical length of the stripline section between points X and Y is made an odd number of quarter-wavelengths at the oscillator frequency since the points X and Y are equidistant from their respective diodes. This introduces the required 90° phase difference between the r.f. signals applied to the two diodes 31. The two mixer outputs at the doppler frequency are available at the terminals of the capacitor 28 on lines 32, 33. The fan shaped elements 30 provide microwave short-circuits at the points Z on the output lines 32, 33 to prevent any r.f. appearing in the low frequency outputs of the unit. The sense of the detected motion, i.e. whether the "target" is approaching or receding (35), is determined from the phase relationship of the two outputs by using logic circuitry 34 in conventional manner. The magnitude of the doppler frequency will then give the target velocity (36) if required.

The above mixer configuration provides the advantages of a conventional balanced mixer, in terms of reduced AM noise and improved sensitivity, while at the same time effectively performing the function of two separate mixers, thus providing a useful saving in components and circuit board space.

It will be appreciated that the 90° phase shift may alternatively be introduced in the oscillator input to the mixer rather than in the received signal input, by applying the oscillator signal to points X and Y and the received signal to the diode connection point.

The capacitors 25, 28 and 29 may comprise discrete, for example surface-mounted, components or may be formed as interdigitated breaks in the stripline conductors.

It will be apparent that the above-described mixer configuration has wider application. Indeed, it may be used in any microwave doppler system.

While a major advantage offered by the invention is the significant reduction in emission at the second harmonic frequency, there are a number of other benefits. These include the compact size and ease of manufacture compared with, say, the waveguide type of motion detector.

Whereas in the specific embodiment described the slot-containing ground plane layer is provided by the microwave circuit board, It will be appreciated that it could alternatively be formed on the antenna board, on the face opposite that carrying the patch arrays. A separate ground plane board could conceivably be used instead. However, since the microwave board will ordinarily need to be double-sided, the described arrangement is preferred. This also enables the antenna board to have a simpler single-sided construction.

It will be appreciated also that the two-patch arrays shown in FIG. 3 are described by way of example only. Either single patches or other designs involving more than two elements may equally be used. Furthermore, the size and configuration of the array can be chosen so that the shape and angle of the radiated beam meets a specified sensitive coverage volume of the unit. In this respect it is to be noted that the antenna board is fabricated separately from the rest of the unit and requires no electrical connection on assembly. Accordingly, the sensitive coverage volume of the unit may be changed, if required, simply by replacing the antenna board with one carrying a different patch array pattern. This represents a considerable advantage over the waveguide type of unit where it may be necessary to increase the depth or change the shape of the horn to adjust the radiation pattern.

We claim:

1. A motion detector unit for detecting motion by means of doppler frequency shift, the unit comprising a microwave circuit board (1), an antenna circuit board (2), and a ground plane layer (4), the two boards being superimposed with said ground plane layer intervening, said microwave circuit board comprising an oscillator (12) and a mixer (14), and said antenna circuit board comprising transmit (8) and receive (7) antennas, each antenna having a respective feed stripline (10,9) which substantially overlies an associated stripline (17,19) on said microwave circuit board, said ground plane layer having, for each antenna (7,8), a respective slot (5,6) to provide coupling between the microwave circuit and the antenna, said slot being resonant at the fundamental frequency of said oscillator, with said feed stripline (9,10) and said associated stripline (19,17) lying orthogonal to the resonant dimension of the slot (5,6) and extending beyond the slot.

2. A motion detector unit according to claim 1, wherein at least one (17,19) of said feed stripline and said associated stripline terminates in a T-section comprising a cross-bar strip (22) parallel with said slot.

3. A motion detector unit according to claim 2, wherein each said stripline (17,19) on the microwave circuit board terminates in a said T-section (22) and includes a further cross-bar strip (23) parallel with said slot but on the opposite side of the slot to the T-section.

4. A motion detector unit according to claim 1, wherein said mixer (14) comprises a pair of diodes (31) connected in series, the common connection point of the diodes constituting a first input of the mixer, and a stripline section (27) which connects the other ends of the diodes (31) via high-pass capacitance means (28), a second input of the mixer at a point (Y) on the stripline section (27) such as to introduce a quadrature phase difference between signals applied to the two diodes (31) via said second input, the two mixer inputs being coupled respectively to said oscillator (12) and said receive antenna (7), the mixer producing, in operation, two doppler outputs (32,33) at the terminals of said capacitance means (28) of identical frequency but differing phase, the phase relationship of the two outputs being indicative of the sense of the detected motion.

5. A motion detector unit according to claim 4, wherein said first input of the mixer is coupled (18) to said oscillator (12) and said second input of the mixer is coupled to the stripline (19) on said microwave circuit board which is associated with said receive antenna (7).

6. A motion detector unit according to claim 1, wherein each said antenna comprises an array of patch elements (7,8) connected to a said feed stripline (9,10) on the antenna circuit board.

7. A motion detector unit according to claim 1, wherein said ground plane layer (4) is carried by said microwave circuit board (1).

8. A microwave mixer for use in detecting target motion by means of doppler frequency shift, the mixer comprising a pair of diodes (31) connected in series, the common connection point of the diodes constituting a first input of the mixer, and a stripline section (27) which connects the other ends of the diodes (31) via high-pass capacitance means (28), said stripline section (27) having a length (X-Y) which is such as to introduce a quadrature phase difference between signals applied to the two diodes via a second input of the mixer at a point (Y) on the stripline section (27), the two mixer inputs being coupled (18,19) respectively in use to a sample of a transmitted microwave signal and a received echo of the transmitted signal from a moving target, the mixer producing, in operation, two doppler outputs (32,33) at the terminals of said capacitor (28) of identical frequency but differing phase, the phase relationship of the two outputs being indicative of the sense of the detected target motion.

9. A microwave mixer according to claim 8, wherein said capacitance means comprises an interdigitated d.c. break.

* * * * *